United States Patent

Talreja et al.

[11] Patent Number: 5,944,837
[45] Date of Patent: Aug. 31, 1999

[54] CONTROLLING FLASH MEMORY PROGRAM AND ERASE PULSES

[75] Inventors: Sanjay S. Talreja, Folsom; Rodney R. Rozman; Mickey Lee Fandrich, both of Placerville; Bharat Pathak, Folsom, all of Calif.

[73] Assignee: Intel Corporation, Santa Clara, Calif.

[21] Appl. No.: 08/912,349

[22] Filed: Aug. 18, 1997

Related U.S. Application Data

[62] Division of application No. 08/879,084, Jun. 19, 1997, which is a continuation of application No. 08/327,708, Oct. 24, 1994, abandoned.

[51] Int. Cl.⁶ .................................................... G06F 12/00
[52] U.S. Cl. .......................... 713/600; 365/218; 711/103
[58] Field of Search ..................................... 713/600, 502; 711/103; 365/218, 185.29

[56] References Cited

U.S. PATENT DOCUMENTS

| 5,424,992 | 6/1995 | Coffman et al. | 365/218 |
| 5,450,360 | 9/1995 | Sato | 365/218 X |
| 5,581,723 | 12/1996 | Hosbun et al. | 711/103 |

*Primary Examiner*—Thomas M. Heckler
*Attorney, Agent, or Firm*—Blakely, Sokoloff, Taylor & Zafman

[57] ABSTRACT

An operation control method and apparatus are described. The apparatus includes a timer circuit, a blocking circuit and a control circuit. The timer circuit provides a done signal upon completion of timing a predetermined elapsed time interval initiated by a start signal. The blocking circuit receives the done signal and provides the done signal as output if the done signal is not blocked when received. The control circuit receives a begin signal indicating that the operation is to be performed and a limit signal to indicate whether or not a condition exists that would prevent the operation from being completed in a single step. If the limit signal indicates the operation can be completed in the single step, the control circuit starts the timing circuit and controls performance of the single step until the done signal is received. If the limit signal indicates the operation cannot be completed in the single step, the control circuit divides the single step into at least two sub-steps, during each sub-step, the control circuit starts the timing circuit and controls performance of the sub-step until the done signal is received. The control circuit blocks output of the done signal from the blocking circuit during each sub-step until a final sub-step. For one embodiment, the operation to be performed is an erase operation specified by a write state machine that specifies an erase block to be erased within a flash memory. Alternately, the operation to be performed is a program operation specified by a write state machine that specifies data to be programmed within a flash memory.

40 Claims, 8 Drawing Sheets

CONTROLLING FLASH MEMORY PROGRAM AND ERASE PULSES

This is a divisional of application Ser. No. 08/879,084, filed Jun. 19, 1997, which is a continuation of prior application Ser. No. 08/327,708 filed on Oct. 24, 1994 now abandoned.

FIELD OF THE INVENTION

The present invention relates generally to control of events within integrated circuits and more particularly to providing a flexible response to state machine events.

BACKGROUND

Electronic systems such as computer systems typically include several components that are implemented as integrated circuits. Modern integrated circuits have an ability to include a limited amount of "intelligence". Thus, by including state machines within an integrated circuit, the integrated circuit can function somewhat autonomously within the system. A state machine can be implemented using a programmable logic array within the integrated circuit. Alternately, a state machine can be implemented within the integrated circuit in the form of a microcontroller and an associated state machine program that is executed by the microcontroller. An intelligent integrated circuit can be ordered to perform a task and will then perform the task autonomously. When the task has completed, the autonomous circuit will typically report that the task has completed and provide results generated by the task to the component that requested the task be performed.

This intelligent component scheme has the benefit of distributing processing burden within the system because there is no longer a need to have a single component control every action of every component within the system. Furthermore, this scheme has the benefit of relieving bus traffic within the system because an intelligent integrated circuit component can be ordered to perform a task without a need to provide additional orders that supervise completion of the task. Moreover, this scheme has the benefit of delegating tasks to a lower level within the system so that the details of the task to be perform become transparent to the component that requests the task be performed.

For example, a flash electrically-erasable programmable read only memory (flash EEPROM) is a type of integrated circuit that has benefited by the inclusion of a state machine. The earliest flash EEPROMs did not have an internal state machine. Every step of complex tasks, such as programming and erasure, was controlled externally to the flash EEPROM. Many modern flash EEPROMs have an internal write state machine to control the write and erase tasks.

The advantage of providing intelligence to a component is offset by the disadvantage of increased design complexity of the component. The state machine must also compete for precious die area within the integrated circuit. Furthermore, the state machine must be tailored to meet the needs of the particular component it will be controlling. Thus, different versions of similar components typically have different state machines to meet the particular needs of each component.

There has also been a recent trend toward lowering the power requirements of portable computers. In order to reduce power consumption, much of the integrated circuitry used in personal computers is being redesigned to run at low voltage levels. Such is the case for flash EEPROMs. The circuitry and components used in portable computers are being designed to operate at voltage levels such as 5 volts and 3.3 volts in order to use less current. This helps to reduce the power requirements of such computers.

Some of the features of portable computers, however, require higher voltages. Recently, flash EEPROMs have been used to store BIOS processes. This memory may be erased and reprogrammed without removing the BIOS circuitry from the computer by running a small update program when the BIOS processes are changed. Other versions of flash EEPROMs are being used for long term storage in place of electro-mechanical hard disk drives. Under the proper conditions, flash EEPROMs can also be used as main memory in place of volatile memory. Erasing and reprogramming a flash EEPROM, however, typically requires approximately twelve volts to accomplish effectively; and the lower voltage batteries provided in portable computers, in general, are not capable of furnishing this voltage with sufficient current to accomplish the operations.

Typically, charge pump circuits have been used to provide a high voltage from a lower voltage source. The positive source method of erasing flash EEPROMs however, draws a substantial amount of current. Similarly, programming such arrays using traditional techniques has required large amounts of current. Charge pumps furnishing such voltages with sufficient current typically utilize large capacitors which require a large amount of die space. Recently it has been discovered that using specially designed charge pumps sufficient current can be generated to accomplish positive source erase and the programming of flash EEPROM memory arrays. A charge pump arrangement for accomplishing positive source erase is disclosed in detail in U.S. patent application Ser. No. 08/119,423, entitled Method And Apparatus For A Two Phase Bootstrap Charge Pump, K. Tedrow et al, filed on Sep. 10, 1993, now U.S. Pat. No. 5,422,586, and assigned to the assignee of the present invention.

It is still desirable, even using advanced charge pumps, to reduce the amount of current used in programming flash EEPROM arrays. A flash EEPROM array is made up of memory cells which include floating gate field effect transistor devices. The N type memory transistors may be programmed by storing a negative charge on the floating gate. A negative charge on the floating gate shifts the threshold voltage of the memory transistor making it less conductive. The condition of the memory transistors (programmed or erased) may be detected by interrogating the cells and sensing whether current flows or not. The programming of memory cells is typically accomplished a word at a time but conventionally requires that the drain of selected cells be placed at six or seven volts, the gate at eleven or twelve volts, and the source at ground. This programming operation draws substantial current because the gate terminal is raised above the level of the drain and source terminals while a significant potential difference is placed between the drain and source terminals.

The simultaneous programming of each bit of a sixteen bit word requires approximately one milliampere of current so that programming one word draws approximately sixteen milliamperes. The peak current drawn during the conventional programming operation may be as high as forty milliamperes. This is a very large amount of current and requires larger charge pumps with larger capacitances that require a large amount of die space and therefore tend to increase rather than decrease the size of components used in portable computers. Moreover, integrated circuit charge pumps cannot be made to operate as efficiently as can stand alone charge pumps because they do not make use of elements such as inductors which maximize efficiency. In fact, such charge pumps operate at efficiencies of approximately forty percent so that, for example, seventy-two milliamperes of peak current are required to supply the sixteen milliamperes necessary for programming a word. For this reason, apparatus and methods which reduce current requirements for programming flash EEPROM memory arrays are very desirable. For example, one approach is to break a word to be programmed into four four-bit nibbles and then program the word a nibble at a time. This nibble programming scheme has the advantage of reducing the programming current required at any given time to a quarter of that required for programming the entire word at once. Thus, less area of the die must be devoted to the charge pumps because they need to provide less current at any given instant. Of course, the disadvantage with the nibble programming scheme is that it quadruples the amount of time required to program a word.

Many computer systems, on the other hand, have a 12 volt source available that can be used by the flash EEPROM when programming and erasing. In such systems, there is no need to use charge pumps. Furthermore, provided the 12 volt source is adequate to ease the current constraint, and further provided there are no other current constraints, nibble programming can be avoided and an entire word can be programmed at once.

One approach to meet these different system needs is to design two separate flash EEPROMs, one to operate in a constraint current environment, and another to operate in an unconstrained current environment Thus, for example, the state machines for the two versions would be different because the former one would have to control nibble programming and the latter would not. One disadvantage with this approach is the need to design, test, manufacture, stock and support separate versions of what otherwise would be essentially the same flash EEPROM. Moreover, such an approach does not permit a flexibility wherein the same part could be used in a low current mode when a constrained current source was available and in a faster, high current mode when the current source was not constrained. An example of this would be a mobile computer system that operated using batteries when in the field, but operated using house current when in the office.

A second approach to meet the different system needs is to provide a single flash EEPROM that can operate using a limited current mode, but that can also operate using an unlimited current mode if an adequate current source is available. An advantage with this approach is the ability to design, test, manufacture, stock and support a single version of the flash EEPROM that can be used in systems that have a current limited supply and those that do not. A disadvantage is that the state machine to control the part is more complex than would otherwise be required because it must operate differently when a low programming current is available than when a high programming current is available. Moreover, the extra complexity can exceed constraints of the state machine. For example, there may be insufficient storage available on an integrated circuit to hold a larger write state machine program that is required to support both current modes.

SUMMARY AND OBJECTS OF THE INVENTION

Therefore, one object of the present invention to provide circuitry that performs an operation initiated by a state machine differently depending upon whether or not constraints are imposed upon the system.

Another object of the present invention is to provide circuitry that permits the same state machine to be used in different versions, and in different generations, of an integrated circuit.

Another object of the present invention is to permit a nonvolatile memory device to detect a constrained current condition and program and erase differently without modifying the write state machine of the nonvolatile memory device.

Another object of the present invention is to permit a nonvolatile memory device to detect a constrained programming current condition and program differently without modifying the write state machine of the nonvolatile memory device.

Another object of the present invention is to permit a nonvolatile memory device to detect a constrained erase current condition and erase differently without modifying the write state machine of the nonvolatile memory device.

An operation control method and apparatus are described. The apparatus includes a timer circuit, a blocking circuit and a control circuit. The timer circuit provides a done signal upon completion of timing a predetermined elapsed time interval initiated by a start signal. The blocking circuit receives the done signal and provides the done signal as output if the done signal is not blocked when received. The control circuit receives a begin signal indicating that the operation is to be performed and a limit signal to indicate whether or not a condition exists that would prevent the operation from being completed in a single step.

If the limit signal indicates the operation can be completed in the single step, the control circuit starts the timing circuit and controls performance of the single step until the done signal is received.

If the limit signal indicates the operation cannot be completed in the single step, the control circuit divides the single step into at least two sub-steps, during each sub-step, the control circuit starts the timing circuit and controls performance of the sub-step until the done signal is received. The control circuit blocks output of the done signal from the blocking circuit during each sub-step until a final sub-step.

For one embodiment, the operation to be performed is an erase operation specified by a write state machine that specifies an erase block to be erased within a flash memory. If there is insufficient erase current available to erase the entire erase block using one erase pulse, the erase block is divided into sub-blocks and the erase pulse is supplied to a different one of the sub-blocks during each of the sub-steps.

Alternately, the operation to be performed is a program operation specified by a write state machine that specifies data to be programmed within a flash memory. If there is insufficient program current available to program an entire word of data using one program pulse, the word of data to program is divided into sub-portions, a different one of the sub-portions is used to form a masked word during each of the sub-steps. The program pulse is supplied during each of the sub-steps.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
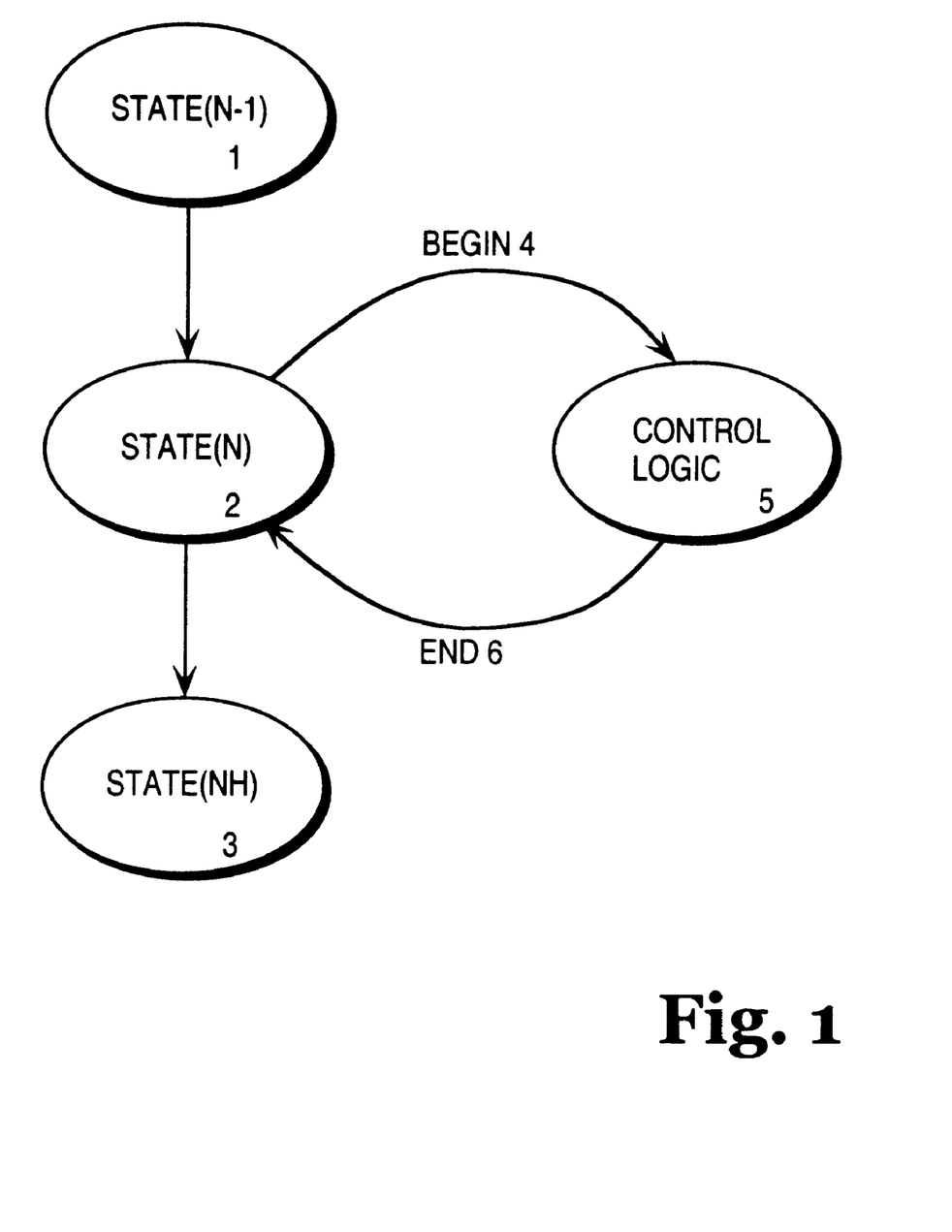
FIG. 1 illustrates a portion of a state transition diagram of a state machine and associated control logic for one of the states of the state machine.

FIG. 1 illustrates a portion of a state transition diagram of a state machine and associated control logic for one of the states of the state machine. The portion of the state machine shown in FIG. 1 is comprised of states N−1, N and N+1 labeled as 1, 2, and 3, respectively. In the state machine of FIG. 1, state (N) 2 controls the initiation of an operation that itself is controlled by control logic 5. If a transition is made to state (N) 2 from state (N−1) 1, state (N) 2 will issue a BEGIN 4 command that will cause control logic 5 to control the performance of the operation. After issuing the BEGIN 4 command, the state machine will idle and thereby remain in state (N) 2 until the operation controlled by control logic 5 has completed. Upon completion of the operation, control logic 5 will issue an END 6 reply to the state machine and the state machine will be able to resume operation. After state (N) 2 has completed, a transition is then made from state (N) 2 to state (N+1) 3.

Under this scheme, a generic state machine can be employed that can be generalized to many different applications. Control details that are specific to a particular application are then implemented in control logic 5. This has the effect of broadening the applicability of the state machine while localizing implementation specific details into control logic that is external to the state machine.

This concept is best illustrated by example. Although the following will present examples drawn from a write state machine of a flash EEPROM, it is to be understood that the inventive concepts presented herein are not so limited. The present invention has application by extension to other types of state machines and to other types of integrated circuits.

Figure 2:
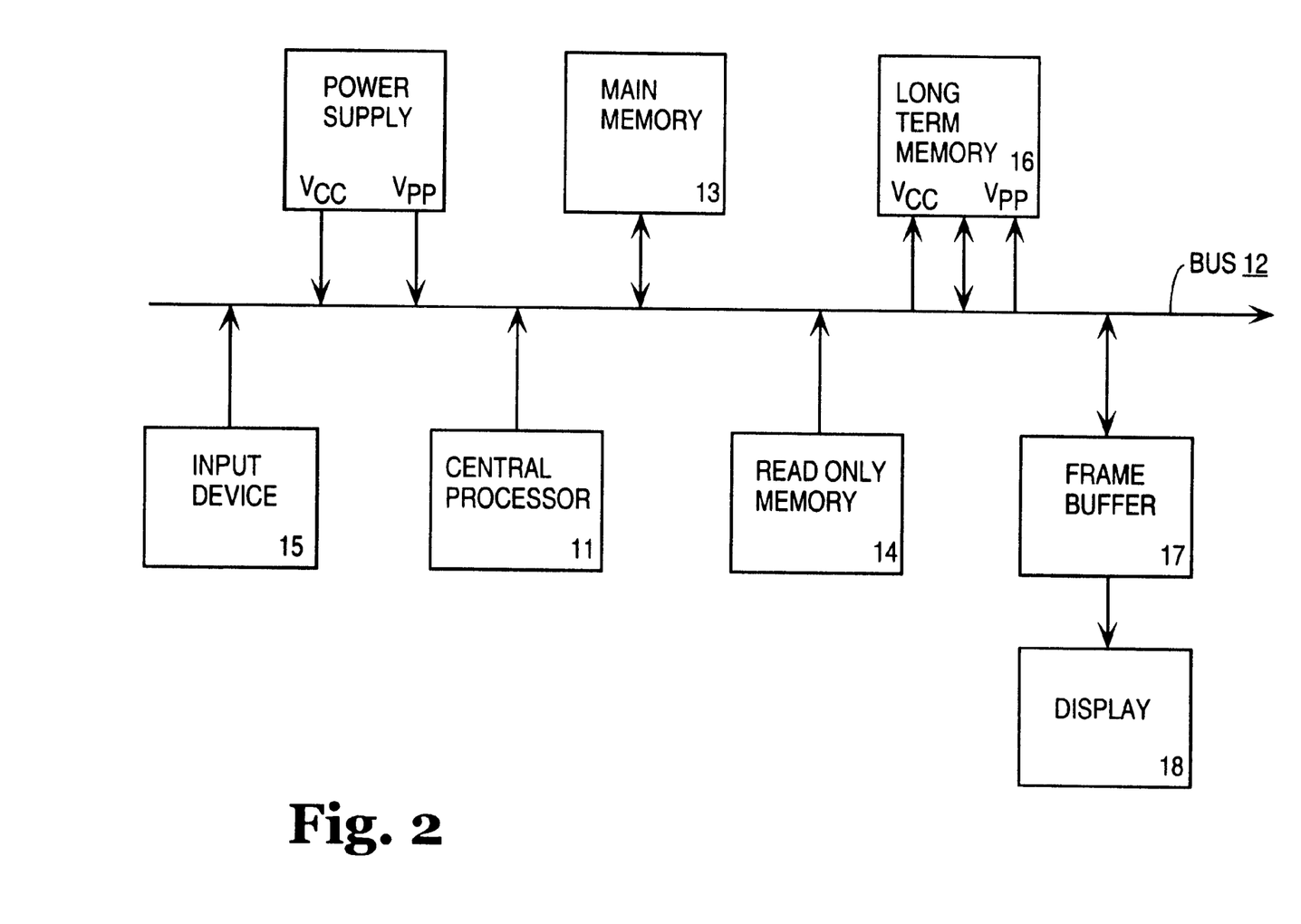
FIG. 2, illustrates a computer system that includes at least one flash EEPROM having an internal state machine.

Referring now to FIG. 2, there is illustrated a computer system 10. The system 10 includes a central processor 11 which carries out the various instructions provided to the computer 10 for its operations. Frequently the instructions from processor 11 will be part of a computer program stored in long term memory 16 or read only memory 14 and initiated by a command entered using input device 15. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM cells adapted to be modified as various ones of the BIOS processes used by a particular computer are changed. If the memory 14 is constructed of flash EEPROM cells, it may be modified by running an update process on the computer itself to reprogram the values stored in the memory 14. Typically, such flash EEPROM will include circuitry for programming and erasing the memory array in order to allow such an update to occur.

Also connected to the bus 12 are various peripheral components such as long term memory 16 and circuitry such as a frame buffer 17 to which data may be written which is to be transferred to an output device such as a monitor 18 for display. Rather than the typical electro-mechanical hard disk drive, a flash EEPROM memory array may be used as the long term memory 16. One particular arrangement for providing long term memory using flash EEPROM memory cells is described in U.S. patent application Ser. No. 07/969,131, entitled A Method and Circuitry For A Solid State Memory Disk, S. Wells, filed Oct. 31, 1992, now U.S. Pat. No. 5,822,781, and assigned to the assignee of the present invention.

Power supply 19 supplies a system operational voltage, over bus 12 to the components of computer system 10. Power supply 19 also supplies a flash EEPROM programming and erase voltage, VPP, over bus 12 to any components of computer system 10 that contain one or more flash EEPROM arrays.

Such flash EEPROM arrays typically include circuitry for programming and erasing the memory arrays. Upon receiving a program or erase command, programming and erasure of the flash EEPROM arrays can be controlled by a write state machine and associated control logic according to the present invention as is explained below in greater detail. Moreover, the typical operating voltages available in a portable computer system are insufficient to erase the transistors of a flash EEPROM array but can only switch (program) those transistors from a one to a zero condition. The condition can be reversed to a one only by applying a voltage (usually twelve volts) higher than typical operating voltages to the source terminals of the memory transistors.

The conventional method of erasing an array of flash EEPROM memory cells (called positive source erase) erases all of the cells together (or at least some large block thereof). When the cells of a block of an array of flash EEPROM memory cells are all erased, they are placed in the condition in which no charge is stored on the floating gate and in which interrogation will produce a one value prior to data being first stored in the array. This is accomplished in a two step process. First, all of the cells in the one condition are programmed to the zero condition; and then the entire block is erased by applying the high voltage at the source terminals of all of the cells to place all of the cells in the one condition. Once the cells have been erased, all of the memory cells are in the one condition. As data is stored in the memory cells of the block, those cells which are to store a one condition remain in the condition in which they were placed when erased while those cells which are to store a zero condition are switched to the programmed condition. Consequently, whenever a portion of a flash EEPROM memory array is programmed, only those cells which are to be placed in the zero condition are switched. Moreover, once programmed, the data stored cannot be changed until the entire block of memory is once again erased.

It is difficult to provide sufficient current to effectively erase and program flash EEPROM memory when erased in the manner described above. For this reason, circuits for programming and erasing which require smaller amounts of currents are desirable. The disadvantage of using circuits for programming and erasing that require smaller amounts of currents is that the low current program and erase operations usually take longer than the same operations when higher current program and erase circuitry can be employed. Thus, if a programming voltage having sufficient potential and current capabilities is available, then the slowness introduced by the circuitry for programming and erasing using smaller amounts of current can be avoided.

Figure 3:
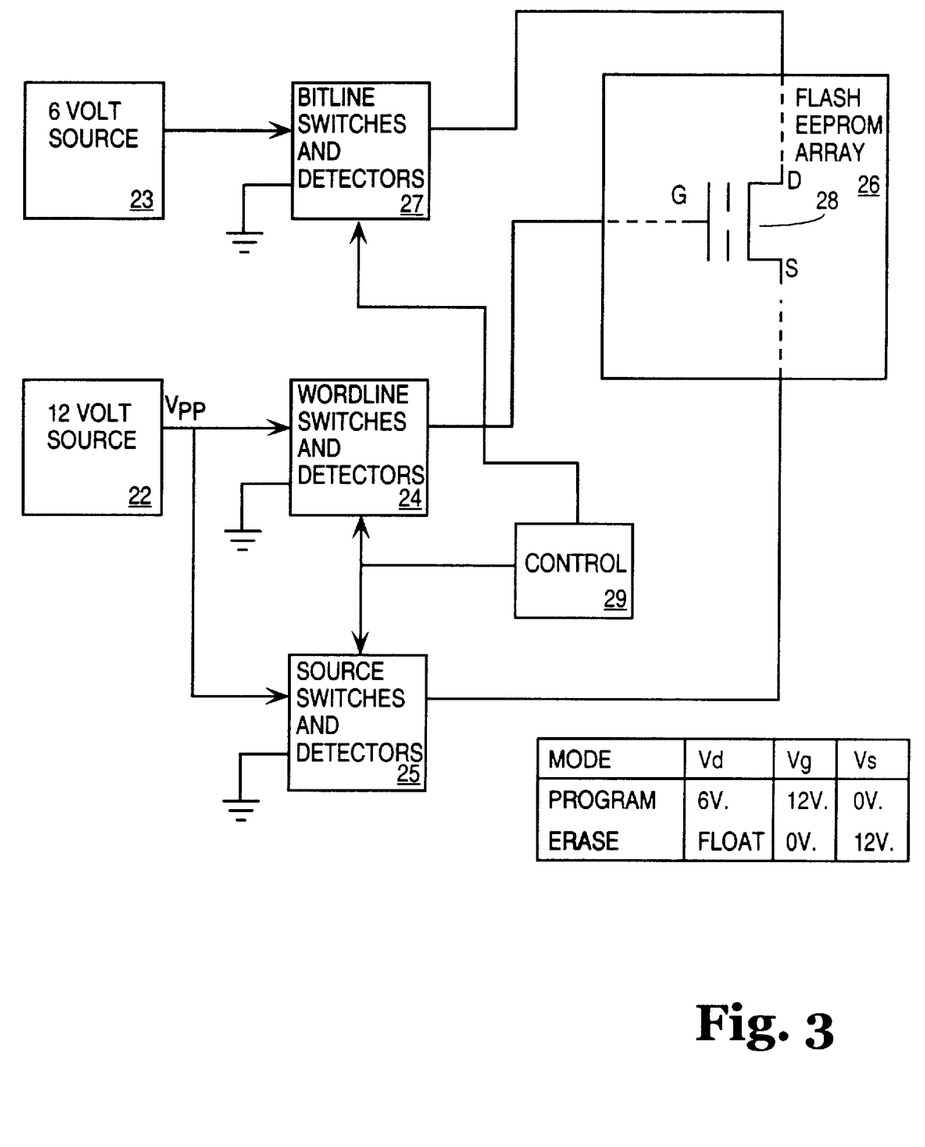
FIG. 3 is a block diagram which illustrates an integrated circuit including a flash EEPROM memory array and circuitry for programming and erasing the flash EEPROM memory array under control of a state machine.

FIG. 3 is a block diagram that illustrates an integrated circuit 20 including a flash EEPROM memory array 26 and circuitry for programming and erasing the flash EEPROM memory array 26 utilizing positive source erase techniques.

Voltage from the 12 volt source 22 is furnished to a set of wordline switches and decoders 24 which, in a manner well known to those skilled in the art, provide voltages at the gate terminals of flash EEPROM memory transistor devices 28 (only one transistor device 28 is illustrated in FIG. 3). Voltage from the 12 volt source 22 is also furnished to a set of source switches and decoders 25 which, in a manner well known to those skilled in the art, provide voltages at the source terminals of flash EEPROM memory transistor devices 28. The voltage furnished by the 6 volt source 23 is furnished to a set of bitline switches and decoders 27 which, in a manner well known to those skilled in the art, provide voltages at the drain terminals of flash EEPROM memory transistor devices 28. Each of the sets of switches and decoders 24, 25, and 27 is controlled by signals from a control circuit 29 to provide appropriate voltages at erase and programming to accomplish those results. With the exception of the details of the present invention as set forth below, the use of such a control circuit is described in U.S. patent application Ser. No. 08/086,186, entitled Flash Memory Array System And Method, M. Fandrich et al, filed Jun. 30, 1993, now U.S. Pat. No. 5,509,134, and assigned to the assignee of the present invention. According to the teachings of the present invention, the control circuit 29 is a state machine and associated control-logic. For one embodiment, the state machine is implemented as a microprocessor designed to provide control of all of the operations of the memory array 26 including reading, programming, and erasing among other things. Alternately, the state machine is implemented as a programmable logic array (PLA).

At the lower right corner of FIG. 3 is shown a table which illustrates the voltages which are typically applied to the terminals of the memory cells during the program and erase operations using positive source erase techniques. The voltages set forth therein are representative voltages of one method but other methods are not precluded. As may be seen, the erasing of the memory device 28 requires that a positive twelve volts be applied to the source terminal of the device 28, ground be applied to the gate terminal, and the drain be floated. During programming, on the other hand, the source is typically grounded while twelve volts is applied to the gate terminal and six or seven volts is applied to the drain terminal. Because the gate terminal is raised to a potential greater than either the source or drain terminals and a substantial potential is applied between source and drain terminals, substantial drain current will flow. Because of this substantial drain current when programming is conducted, the source of the programming voltage must be able to furnish a substantial amount of current.

To assure that there is sufficient current available to erase the memory cells of an erase block of the array illustrated in FIG. 3, an arrangement is provided in which smaller amounts of current are required when the erasure current is constrained. For one embodiment, in order to reduce the instantaneous current used when erasing the memory cells of an erase block of the flash EEPROM memory array, a circuit has been provided to control the block erasure such that portions of the block are erased sequentially in sub-blocks until the entire block has been erased, e.g., erased half an erase block at a time. Thus, rather than erasing all of the cells of an erase block simultaneously as has been done in prior art arrangements, a lesser number of cells are erased so that less instantaneous and peak current is required during any block erase operation. Consequently, both the average and peak current; are reduced to values which may be conveniently provided by the constrained current source. One disadvantage to this approach is that erasing each sub-block takes as long as would be required to erase the entire block if sufficient current was available to do so. Thus, if a sufficient erase current is supplied to the flash EEPROM, then erasure is performed a block at a time instead of using sub-blocks.

The present invention permits the write state machine of the flash EEPROM to control the erasure of the erase block in a manner whereby the write state machine operates identically whether the block is erased all at once or is erased sequentially in sub-blocks. This is accomplished by providing block erase control logic, responsive to the write state machine, that controls the actual erasure once the write state machine signals the control logic that a block is to be erased. Referring again to FIG. 1, for one embodiment, state (N) 2 is the state of the write state machine wherein an erase operation is to be performed, i.e. the erase block state, and control logic 5 is the erase control logic. Thus, when an erase block of the flash EEPROM array is to be erased, the write state machine will enter state (N) 2 and the BEGIN 4 command will be sent to control logic 5. Control logic 5 will control the erasure of the erase block differently depending upon whether there is sufficient erasure current available so that the block can be erased all at once or whether the block must be erased sequentially using sub-blocks. Regardless of how the block has been erased, once the block erasure has completed, control logic 5 will reply END 6 to state (N) 2 and the state machine can then continue to state (N+1) 3. Note that because the actual erasure details are transparent to the write state machine, the same write state machine can be used in a flash EEPROM that does not have erasure current limits and in a flash EEPROM that always has erasure current limits. This is the case even though the former would always erase an entire erase block at a time and the latter would never erase an entire erase block at a time, but would instead always erase the erase block using a series of sequential sub-blocks. Although the same write state machine would be used in each case, the particular erase control logic would be changed to meet the needs of the particular flash EEPROM into which it was to be incorporated. Alternately, as will be shown below, the same erase control logic can be used in each case, provided that the erase control logic has been designed so that it can control both operational modes.

Figure 4:
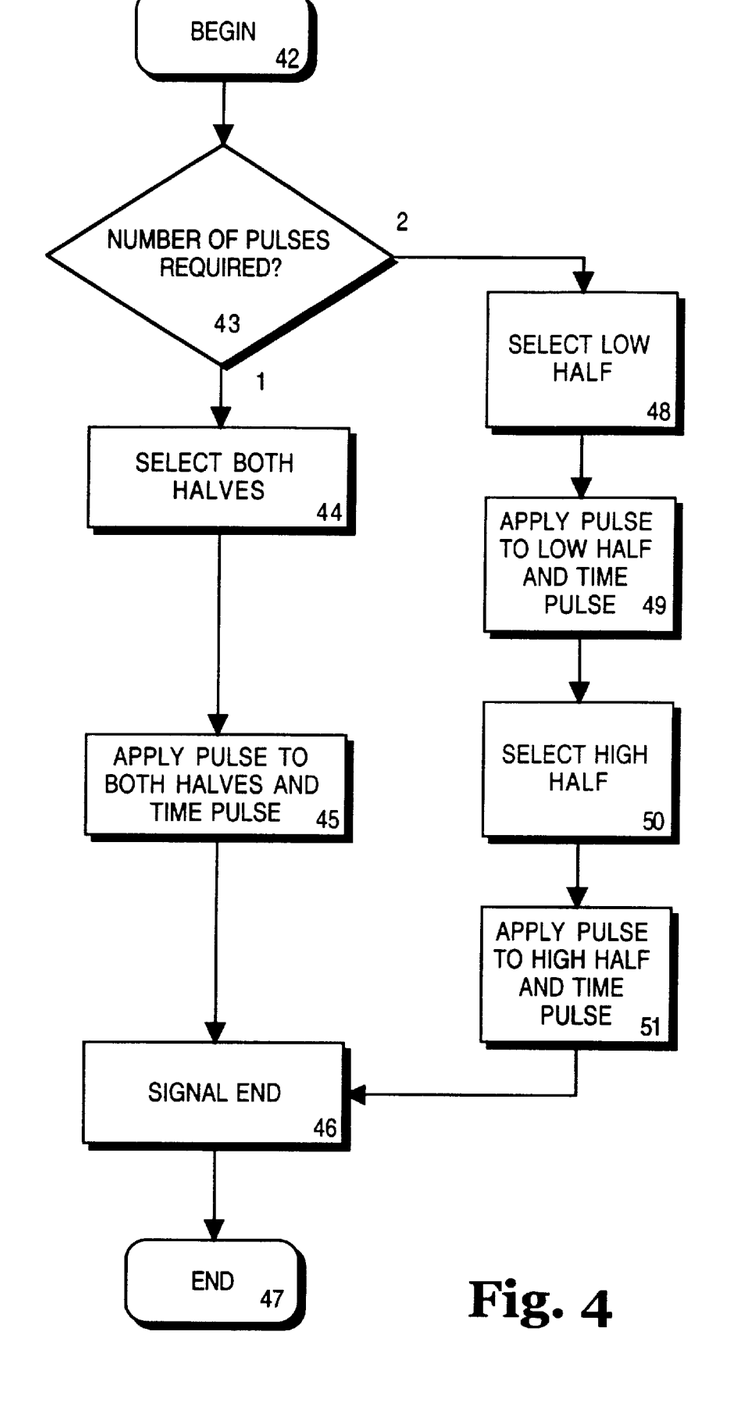
FIG. 4 illustrates a flow chart for erase control logic that can be employed to control the erasure of an erase block differently depending upon whether there is sufficient erasure current available to erase the block all at once or whether the block must be erased sequentially using subblocks.

FIG. 4 illustrates a flow chart for one embodiment erase control logic that can be employed to control the erasure of an erase block differently depending upon whether there is sufficient erasure current available so that the block can be erased all at once or whether the block must be erased sequentially using sub-blocks. In the example of FIG. 4, the erase block has been divided into two sub-block halves, an upper half and a lower half. Both the lower half and the upper half can each be erased separately, or together. If the lower and upper halves are erased separately, both halves must be erased in order for the entire erase block to be erased.

When the begin erase signal is received (bubble 42), a test is made (decision block 43) to determine whether the number of erasure pulses required is one or two. If there is sufficient current to erase both halves at once, then only a single erase pulse will be required. The control logic will therefore select both halves of the erase block to be erased (block 44). Next the single erase pulse will be timed and applied to both halves (block 45). Upon completion of the single erase pulse, the erase block will have been erased and the end of the erase operation will be signaled (block 46) before control is passed back to the write state machine (bubble 47).

If, on the other hand, there is only sufficient erase current to erase half of the erase block at a time, then two erase pulses will be required. The control logic will therefore select the low half of the erase block to be erased (block 48) and a first erase pulse will be timed and applied to the low half (block 49). Then the control logic will select the high half of the erase block to be erased (block 50) and a second erase pulse will be timed and applied to the high half (block 51). Upon completion of the second erase pulse, the erase block will have been erased and the end of the erase operation will be signaled (block 46) before control is passed back to the write state machine (bubble 47).

Figure 5:
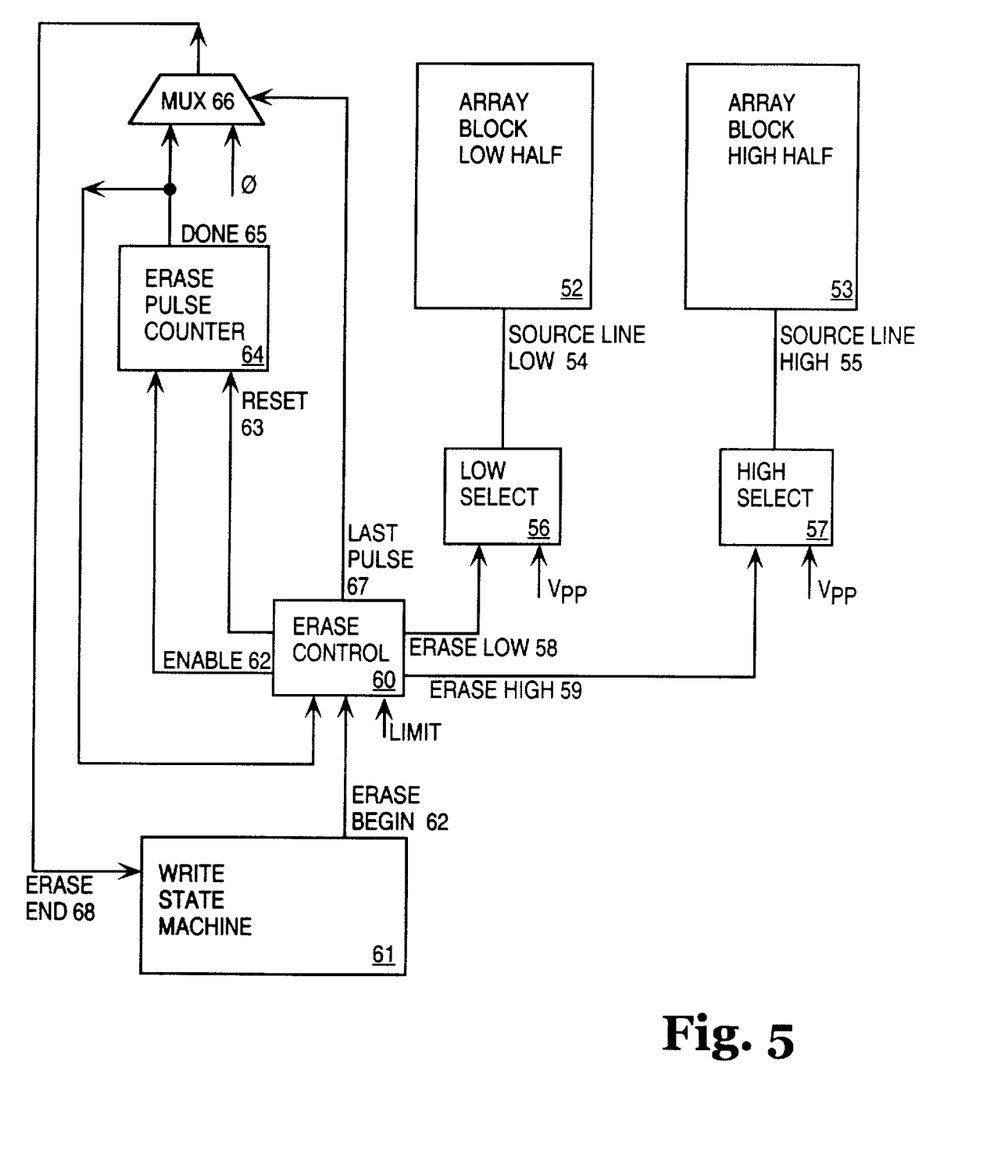
FIG. 5 illustrates an embodiment of an erase control circuit described in the flow chart of FIG. 4.

FIG. 5 illustrates an embodiment of an erase control circuit described in the flow chart of FIG. 4. In FIG. 5, a single erase block is shown. The erase block has been separated into two sub-block portions, array block low half 52 and array block high half 53. These sub-block portions are physically separated on the flash die. In spite of their physical separation, the two block halves 52 and 53 can be electrically coupled together so that they can be treated logically as a single erase block. An example of an architecture suitable for this purpose can be found in U.S. Pat. No. 5,267,196, entitled Floating Gate Nonvolatile Memory With Distributed Blocking Feature, S. Talreja et al, issued Nov. 30, 1993, and assigned to the assignee of the present invention. Therein can be found a description of an architecture wherein each erase block of a flash EEPROM array is divided into 16 physically distinct sub-blocks, with one sub-block being used to store a different bit of each word stored within the block. Although the erase block disclosed therein is physically separated into 16 portions, all 16 portions effectively share a common source line. This is because, even though each of the 16 portions has its own associated source line and source switch, the 16 source switches are switched together and operate as one switch for the entire block. Therefore the entire erase block must be erased at once using a single erase pulse. It can be seen in FIG. 5, however, that the prior architecture has been modified so that separate source lines (54 and 55) and separate source line select circuitry (56 and 57) are provided to each of the two halves (52 and 53) of the erase block shown. Thus, the assertion of signal ERASE LOW 58 by erase control circuit 60 will cause low erase select circuit 56 to apply the programming voltage VPP to source line 54 of array block low half 52 until signal ERASE LOW 58 is deasserted. Similarly, the assertion of signal ERASE HIGH 59 by erase control circuit 60 will cause high erase select circuit 57 to apply VPP to source line 55 of array block high half 53 until signal ERASE HIGH 59 is deasserted. If both of the halves (52 and 53) are selected simultaneously (i.e., signals ERASE LOW 58 and ERASE HIGH 59 are asserted simultaneously), both halves (52 and 53) can be erased at once. Conversely, if only one half is selected at a time, then only the selected half will be erased.

When write state machine 61 enters an erase block state, write state machine 61 will assert signal ERASE BEGIN 62 thereby causing erase control circuit 60 to assume control of the erasure of the erase block specified by the write state machine.. Signal LIMIT is input to erase control circuit 60 to indicate whether there is limited erase current and the erase block must be erased in two halves, or whether there is sufficient erase current to erase both halves at once. Erase control circuit 60 will also assert signals RESET 62 to reset the counter in erase pulse counter 64 and then assert signal ENABLE 62 to cause the reset pulse counter to begin timing a single erase pulse. If there is sufficient current to erase both halves (52 and 53) at once, erase control circuit 60 will assert signals ERASE LOW 58 and ERASE HIGH 59 until signal DONE 65 from erase pulse counter 64 is asserted to indicate that the erase pulse has completed. Because both halves 52 and 53 are being erased at once, the single erase pulse will also be the last erase pulse. Therefore, erase control circuit 60 will set control signal LAST PULSE 67 to cause 2:1 multiplexer (MUX) 66 to pass signal DONE 65 through to write state machine 61 as signal ERASE END 68. Upon receiving signal ERASE END 68 (i.e., when the first pulse completes), write state machine 61 will continue to the next state following the erase block state.

If there is not sufficient current to erase both halves (52 and 53) at once, during a first pulse, erase control circuit 60 will assert signal ERASE LOW 58 but will not assert signal ERASE HIGH 59, until signal DONE 65 from erase pulse counter 64 is asserted to indicate that the first erase pulse has completed. Because only half 52 is being erased, the first erase pulse will not be the last erase pulse. Therefore, during the first pulse, erase control circuit 60 will set control signal LAST PULSE 67 to cause 2:1 multiplexer (MUX) 66 to block signal DONE 65 and instead pass a zero signal through to write state machine 61 as signal ERASE END 68. Therefore, at the end of the first pulse, write state machine 61 will not change state but will instead remain idle.

Upon completion of the first pulse, erase control circuit 60 will assert signals RESET 62 to reset the counter in erase pulse counter 64 and then assert signal ENABLE 62 to cause the reset pulse counter to begin timing a second erase pulse. During the second pulse, erase control circuit 60 will assert signal ERASE HIGH 59 but will not assert signal ERASE LOW 58, until signal DONE 65 from erase pulse counter 64 is asserted to indicate that the second erase pulse has completed. Because both halves 52 and 53 will then have been erased, the second erase pulse will also be the last erase pulse. Therefore, during the second pulse, erase control circuit 60 will set control signal LAST PULSE 67 to cause 2:1 multiplexer (MUX) 66 to pass signal DONE 65 through to write state machine 61 as signal ERASE END 68. Upon receiving signal ERASE END 68 (i.e., when the second pulse completes), write state machine 61 will continue to the next state following the erase block state.

For an alternate embodiment, if the current available is only sufficient to erase a smaller portion of the erase block at a time, the circuit of FIG. 5 is modified such that smaller portions of the erase block can be selected and erased at a given time. Thus, in using the architecture wherein an erase block is separated into 16 physically distinct parts, by providing separate source lines to each of the 16 portions, the erase block can be erased using 16 successive erase pulses, one pulse per each of the 16 portions. In such a case, the instantaneous erase current would be a sixteenth of that required to erase a block using a single pulse.

Alternately, the circuit of FIG. 5 can be modified so that multiple counter circuits 62 are used such that a different counter is used to time each of the separate pulses that are required. For yet another embodiment, rather than resetting counter 62 after each pulse, the counter would continue to count until the last pulse had completed, but would generate a DONE 65 signal after each individual pulse completed.

The present invention can also be applied to situations wherein there is a limited programming current. For example, the case may be such that flexibility in programming control is required because under some conditions there will be sufficient current to program an entire word at a time and under other conditions there will not. For example, there may be conditions when there is only sufficient current to program a byte (i.e., half of a word) at a time. In such a case, if the current was not limited, the word to program could be programmed all at once using a single program pulse. If the current was limited, however, the word could be programmed in two halves. Thus, the word could be broken up into a low and a high byte with each byte programmed using a separate programming pulse.

Furthermore, it may be the case that an entire word is the smallest portion of the array that can be selected to be programmed individually. In such a case, the word can still be programmed in parts. This is because no current is drawn when programming a one value into a flash EEPROM cell. In flash programming, it is only when a one is changed to a zero that current is drawn. Therefore a masking operation can be performed to ensure that a word only has a limited number of zeros in it, and hence, when the word is programmed, the current required will also be limited. For example, one may desire to program a word that has every bit set to zero (i.e., 16 zeros must be written) but may only have sufficient current available to program eight zeros at a time. In this example, two successive words can be programmed, the first word to program can be formed by masking the upper byte to all one values and the second word to program can be formed by masking the lower byte to all one values. Thus, the information content of the entire word to program will be maintained and one can ensure that the current constraint will not be exceeded because no more than eight zeros will ever be programmed at any given time.

As with the erase block scheme, the number of pulses can be varied to suit the amount of current that is available. Thus, if there is only sufficient current to program four zeros at a time, the word to program can be masked into four 4-bit nibbles. This can be extended down to the case wherein each bit of a word is masked separately and the word is programmed a bit at a time using sixteen successive program pulses.

In all of the above examples, once it has been determined whether or not the limit applies, the number of pulses required is known. In the case of programming, however, it is possible to improve upon the scheme by masking the word to program in such a way that the average number of number of pulses required in the current limited case is decreased. In the above example where the word to program was masked into four nibbles, four pulses were always used, regardless of the number of zeros being programmed in each nibble. Because of the masking, one was sure that no nibble would have more than four zeros. Because each nibble was formed blindly, however, there was no guarantee that any zeros were being programmed during any given pulse. Such a scheme is called "dumb" nibbling.

An improved version of nibbling, called smart nibbling, is disclosed in U.S. patent application Ser. No. 08/252,850 entitled, Improved Method And Apparatus For Sequential Programming Of A Flash EEPROM Memory Array, J. Javanifard, filed Jun. 2, 1994, now U.S. Pat. No. 5,430,674, and assigned to the assignee of the present invention. Smart nibbling can decrease the average number of nibbles that are required to program a word. When programming a word, only the zeros of the word must be written. This is because the block to which the word is to be programmed must be erased before the word can be programmed. During the erase operation, each cell of the block is set to store the value one. Thus, under the smart nibbling scheme, smart "nibbles" to program are formed in a manner such that each "nibble" has no more than a predetermined number of zeros. On average, a word to program has as many zeros as ones. Therefore, even though the worst case will still require four smart nibbles to program a word, on average, only two smart nibbles will be required. Thus, smart nibbling by programming four zeros at a time can decrease the instantaneous programming current required to a quarter of that required when programming a word at a time and, on average, take only twice as long as if the entire word was programmed at once.

This can best be illustrated by the following example wherein for simplicity a four bit nibble is the smallest unit that can be addressed for programming and there is only sufficient current to program two zeros at any given time. The following table describes the programming operations required.

| DATA TO PROGRAM | ZEROS TO PROGRAM | PULSES REQUIRED | FIRST PULSE | SECOND PULSE |
| --- | --- | --- | --- | --- |
| 0000 | 4 | 2 | 1100 | 0011 |
| 0001 | 3 | 2 | 1001 | 0111 |
| 0010 | 3 | 2 | 1010 | 0111 |
| 0011 | 2 | 1 | 0011 | — |
| 0100 | 3 | 2 | 1100 | 0111 |
| 0101 | 2 | 1 | 0101 | — |
| 0110 | 2 | 1 | 0110 | — |
| 0111 | 1 | 1 | 0111 | — |
| 1000 | 3 | 2 | 1100 | 1011 |
| 1001 | 2 | 1 | 1001 | — |
| 1010 | 2 | 1 | 1010 | — |
| 1011 | 1 | 1 | 1011 | — |
| 1100 | 2 | 1 | 1100 | — |
| 1101 | 1 | 1 | 1101 | — |
| 1110 | 1 | 1 | 1110 | — |
| 1111 | 0 | 0 | — | — |

Figure 6:
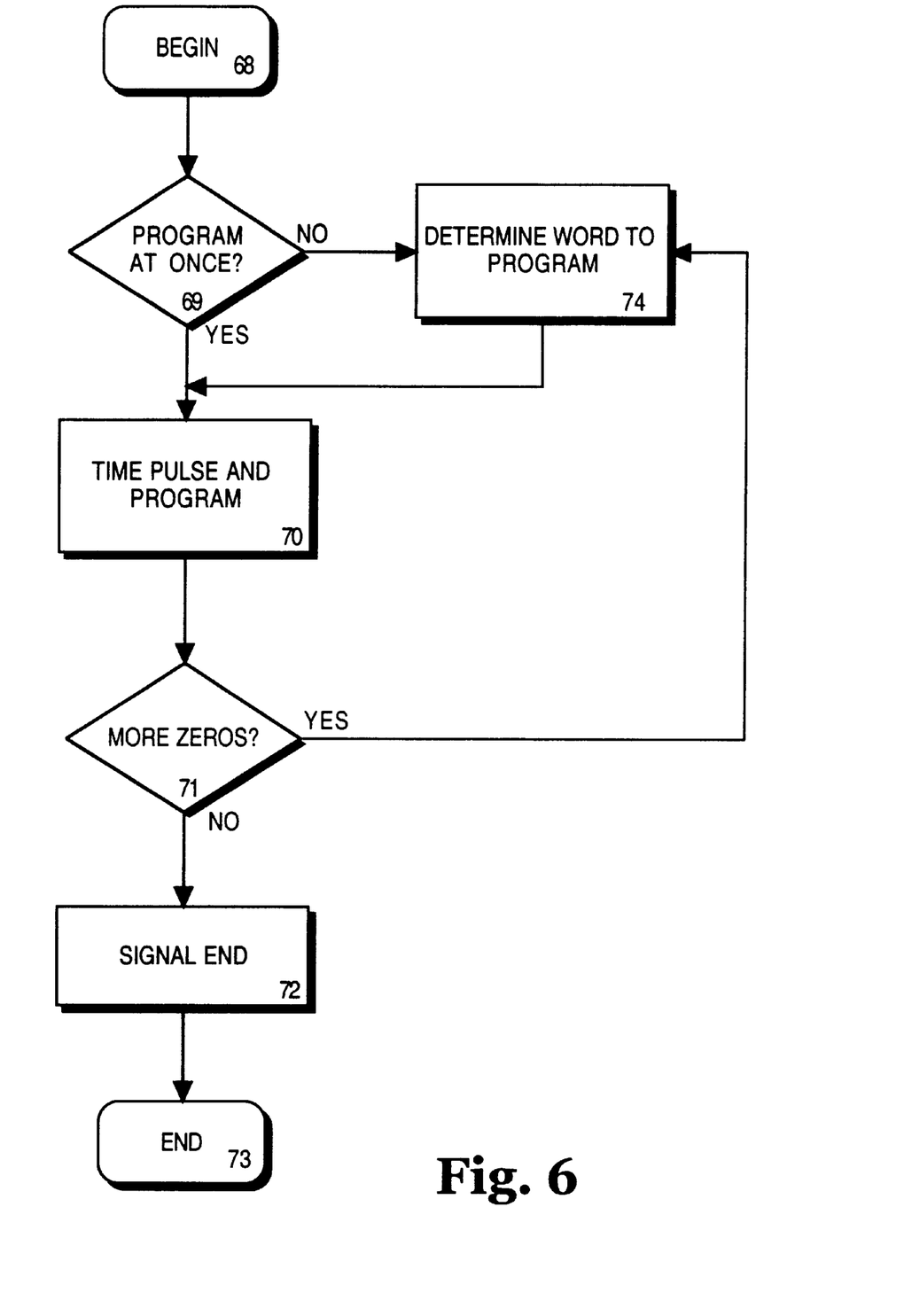
FIG. 6 illustrates a flow chart for program control logic that can be employed to control the programming of a word differently depending upon whether there is sufficient programming current available to program the word all at once or whether the word must be programmed sequentially using smart nibbles because the programming current is limited.

FIG. 6 illustrates a flow chart for one embodiment of program control logic that can be employed to control the programming of a word differently depending upon whether there is sufficient erasure current available so that the word can be programmed all at once or whether the word must be programmed sequentially using smart nibbles because the programming current is limited.

When the begin program signal is received (bubble 68), a test is made (decision block 69) to determine whether the word can be programmed at once or whether multiple pulses may be required because of a limited programming current. If there is sufficient current to program the word at once, then only a single program pulse will be required. The word to be programmed will be known because no masking will be required. This is because even if every bit of the word to program contains a zero, there is sufficient programming current available to program each zero of the word at the same time. The control logic will therefore time a single program pulse and program the word (block 70). Upon completion of the single program pulse, the word will have been programmed. A more zeros test can then be made and, because there are no more zeros to program (decision block 71) this will be the last pulse. Therefore, the end of the program operation will be signaled (block 72) before control is passed back to the write state machine (bubble 73).

If, on the other hand, there is not sufficient programming current to program the entire word using a single pulse, then one or more pulses may be required. Because smart nibbling techniques are being used, the actual number of programming pulses required will depend upon the number of zeros in the word to be programmed, and upon the number of zeros that can be programmed using a current limited program pulse. In the current limited case, the first word to be programmed will be calculated (block 74) and a first programming pulse will be timed and applied to program the masked word (block 70). Then the control logic will determine (decision block 71) whether another pulse will be required, i.e., whether there are more zeros to program. If there are more zeros to program, then the next word to program will be determined (block 74) and another programming pulse will be timed so that the next smart nibble word can be programmed (block 70). A test will then be made again (decision block 72) to determine whether or not another nibble must be programmed. Eventually, every zero in the word to be programmed will have been programmed, and the end of the program operation will be signaled (block 72) before control is passed back to the write state machine (bubble 73).

Figure 7:
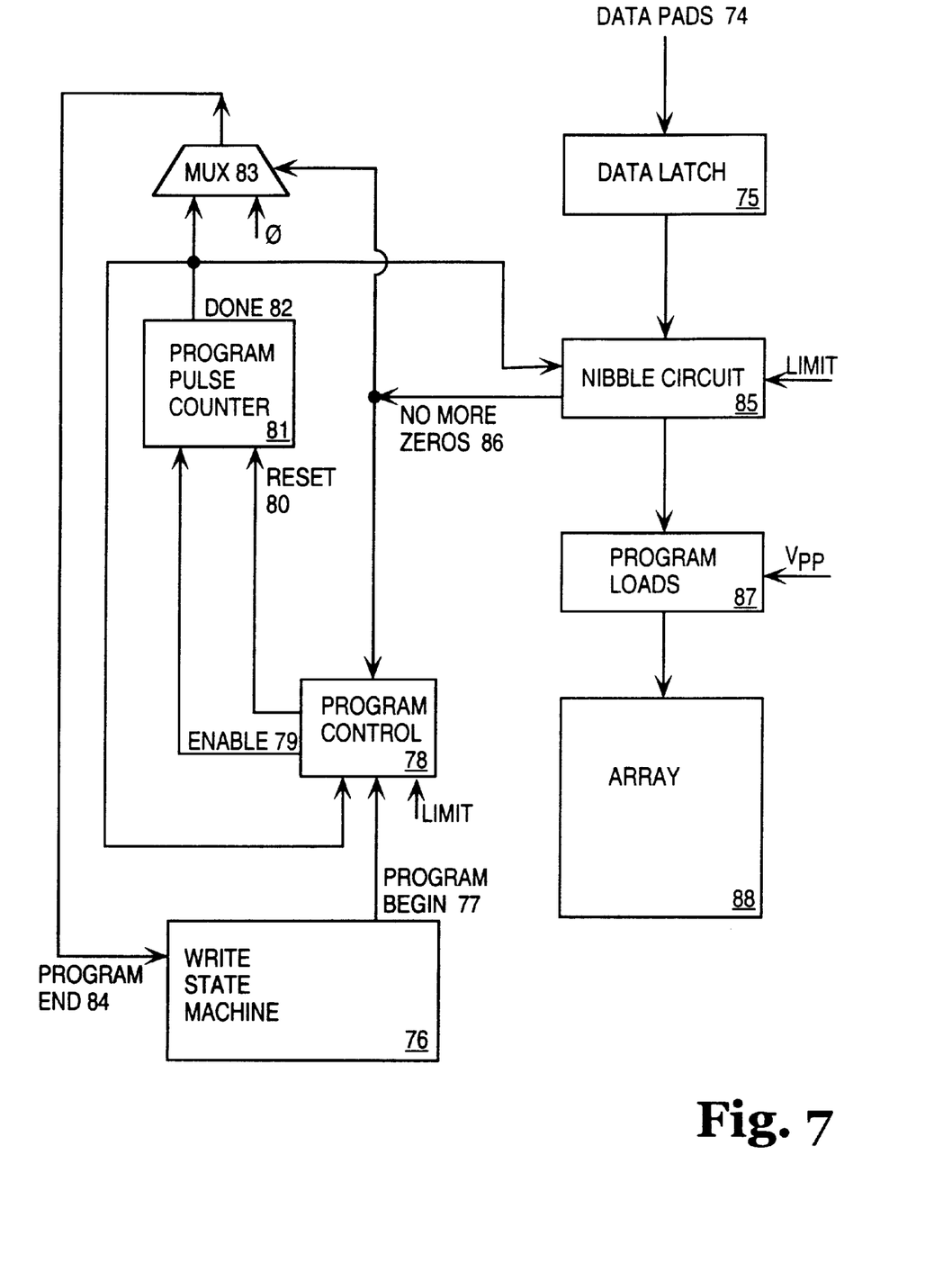
FIG. 7 illustrates an embodiment of a program control circuit described in the flow chart of FIG. 6.

FIG. 7 illustrates an embodiment of a program control circuit described in the flow chart of FIG. 6. In FIG. 7, a word to be programmed enters the flash EEPROM over data pads 74 and is latched into data latch 75.

When write state machine 76 enters a program word state, the word to be programmed in data latch 75 will be programmed into array 88. Write state machine 76 will assert signal PROGRAM BEGIN 77 thereby causing program control circuit 78 to assume control of the programming of the word latched in data latch 75. Signal LIMIT is input to program control circuit 78 to indicate whether there is limited programming current, and the word must be programmed using smart nibbles, or whether there is sufficient programming current to program the entire word at once. Signal LIMIT is also provided to nibble circuit 85. If there is sufficient programming current to program a word at once, signal LIMIT will cause nibble circuit 85 to pass the word to be programmed (stored in data latch 75) directly through to program loads 87. Based upon the address of the word to be programmed, program loads 87, in turn, select the location within array 88 so that the word can be programmed. Nibble circuit 85 will also assert signal NO MORE ZEROS 86 to signify to program control circuit 78 that the current programming pulse is the last pulse required. Program control circuit 78 will then assert signal RESET 80 to reset the counter in program pulse counter 81 and assert signal ENABLE 79 to cause the reset pulse counter to begin timing a single programming pulse. Because there is sufficient current to program the entire word using a single pulse, nibble circuit 85 will assert signal NO MORE ZEROS 86 until signal DONE 82 from program pulse counter 81 is asserted to indicate that the program pulse has completed. Thus, nibble circuit 85 will cause 2:1 multiplexer (MUX) 83 to pass signal DONE 82 through to write state machine 76 as signal PROGRAM END 84. Upon receiving signal PROGRAM END 84 (i.e., when the first pulse completes), write state machine 61 will continue to the next state following the program word state.

If signal LIMIT indicates that there is not sufficient current to program the entire word at once, nibble circuit 85 will mask the first smart nibble to be provided to program loads 87. If the word to program can be programmed in a single smart nibble, nibble circuit 85 will assert signal NO MORE ZEROS 86 and the word will be programmed using a single pulse, as was the case when the programming current was not limited.

If more than one smart nibble is required, then nibble circuit 85 will not assert signal NO MORE ZEROS 86 thereby indicating to program control circuit 78 that the current pulse is not the last pulse, i.e., that at least one more programming pulse will be required. Program control circuit 78 will then assert signal RESET 80 to reset the counter in program pulse counter 81 and assert signal ENABLE 79 to cause the reset pulse counter to begin timing a programming pulse. Because there is insufficient current to program the entire word using a single pulse, signal NO MORE ZEROS 86 will cause 2:1 multiplexer (MUX) 83 to block signal DONE 82 and instead pass a zero signal through to write state machine 76 as signal PROGRAM END 84. Therefore, write state machine 76 will not change state but will instead remain idle at the end of the first pulse.

Because signal NO MORE ZEROS 86 is not asserted, upon completion of the first pulse, program control circuit 78 will receive signal DONE 82 and will assert signal RESET 80 to reset the counter in program pulse counter 81, and then assert signal ENABLE 79 to cause the reset pulse counter to begin timing a second programming pulse. Nibble circuit 85 will also receive the signal DONE at the completion of the first pulse and will mask the next smart nibble to be programmed during the second pulse. This process will continue until the pulse wherein the last smart nibble is to be programmed. During the last pulse, nibble circuit 85 will assert signal NO MORE ZEROS 86 to cause 2:1 multiplexer (MUX) 83 to pass signal DONE 82 through to write state machine 76 as signal PROGRAM END 84. Upon receiving signal PROGRAM END 84 (i.e., when the last pulse completes), write state machine 76 will continue to the next state following the program word state.

For one embodiment, nibble circuit 85 will reset and prepare for the next word to be programmed whenever signal DONE 82 is asserted and signal NO MORE ZEROS 86 is asserted. Alternately, signal PROGRAM BEGIN 77 can be provided to nibble circuit 85 to cause nibble circuit 85 to reset each time a word is to be programmed.

Figure 8:
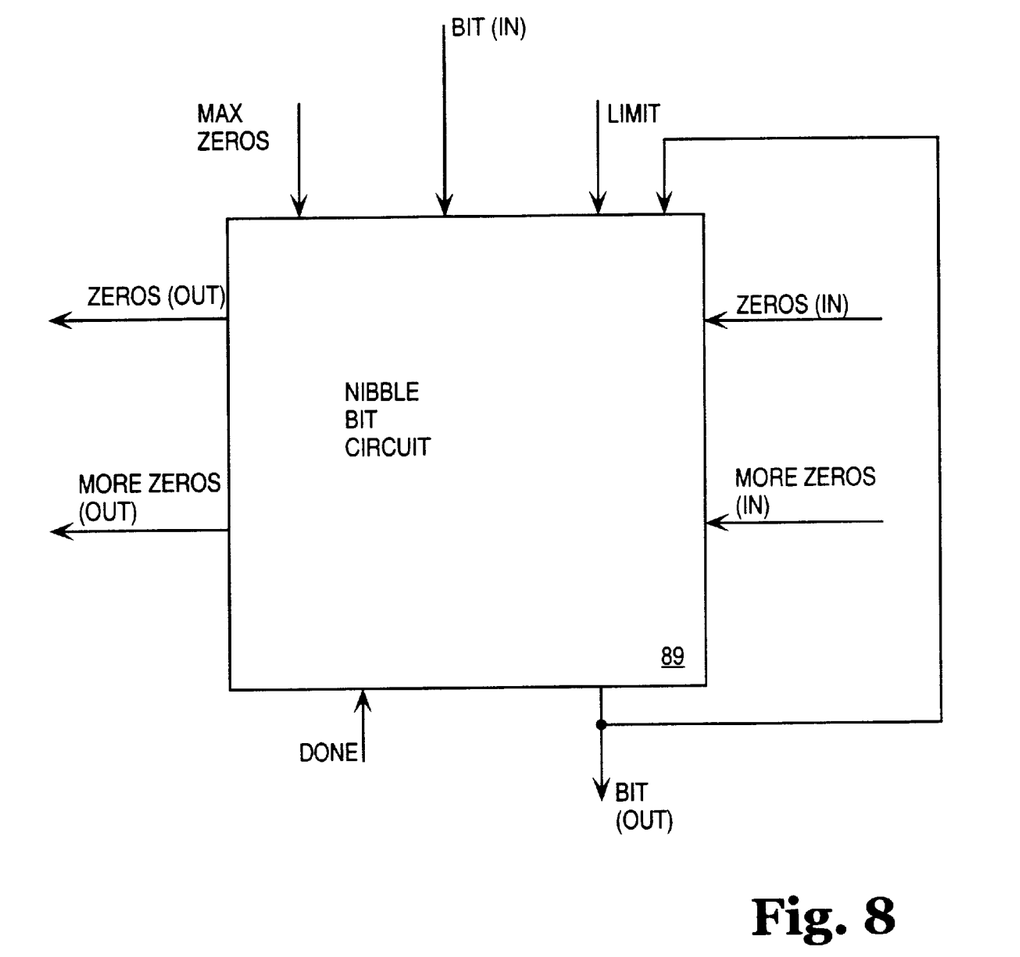
FIG. 8 illustrates an embodiment of an individual nibble bit circuit of nibble circuit 85 of FIG. 7.

FIG. 8 illustrates an embodiment of an individual nibble bit circuit of nibble circuit 85 of FIG. 7. A nibble circuit 85 that is a word wide can be formed by 16 separate nibble bit circuits 89 illustrated in FIG. 8, one nibble bit circuit 89 for every bit of the word to be programmed. The 16 nibble bit circuits 89 would be daisy chained together so that each nibble bit circuit 89 except the least significant bit circuit would receive signals ZEROS (OUT) and MORE ZEROS (OUT) from the nibble bit circuit of the next less significant bit as signals ZEROS (IN) and MORE ZEROS (IN), respectively. In the case of the nibble bit circuit 89 corresponding to the least significant bit, signals ZEROS (IN) and MORE ZEROS (IN) would both be set to zero. In the case of the most significant bit, signal MORE ZEROS (OUT) is inverted to form signal NO MORE ZEROS and signal ZEROS (OUT) is ignored.

Signal BIT (IN) is provided by the data latch 75 (FIG. 7) and has the value of the bit of the word to be programmed that corresponds to its particular nibble bit circuit 89. Thus, if nibble bit circuit 89 is for the third least significant bit of the word to be programmed, signal BIT (IN) will have the value of the third least significant bit of data latch 75. If signal LIMIT indicates that the entire word can be programmed in a single pulse, signal BIT (OUT) will have the same value as signal BIT (IN) and this value will be provided as signal BIT (OUT) to the program load.

In the case where the programming current is limited, signal MAX ZEROS will provide a value to nibble circuit 89 to indicate the maximum number of zeros that can be programmed using a single pulse. Thus, for example, for one embodiment, the programming current can be sufficient to program no more than 4 zeros at a time and MAX ZEROS will have the value 4. For another embodiment, the programming current can be sufficient to program no more than 6 zeros at a time and MAX ZEROS will have the value 6. Thus, for one embodiment, the value of MAX ZEROS is a value that can be changed depending upon the severity of the programming current limitation. Alternately, signal MAX ZEROS is not required because the value of the maximum number of zeros that can be programmed at once in a current limited situation is implicit in the circuitry of nibble bit circuit 89 and cannot be changed.

Signal MORE ZEROS (OUT) is a binary signal that indicates whether or not more zeros are to be programmed, and hence at least one more pulse beyond the present pulse is required. In the case where there is not a limited programming current, only one pulse will be required. Therefore, in that case each nibble bit circuit 89 will automatically deassert MORE ZEROS (OUT).

In the case wherein there is adequate current to program an entire word using a single program pulse, signals ZEROS (OUT) and ZEROS (IN) are not used. In the case wherein the current is limited, and hence more than one pulse may be required, signal ZEROS (IN) is a signal that indicates the number of zeros remaining to be programmed in all of the bits of the word to be programmed having a significance less than the bit corresponding to the nibble bit circuit 89. If signal BIT (IN) has a value of one, then signal ZEROS (OUT) will have the same value as signal ZEROS (IN). If, on the other hand, signal BIT (IN) has a value of zero, signal ZEROS (OUT) will have the value of signal ZEROS (IN) incremented by one. In such a case, the values of signals BIT (OUT) and MORE ZEROS (OUT) will depend upon the value of signal MAX ZEROS. In the case wherein BIT (IN) is a zero and the value of ZEROS (IN) is greater than or equal to MAX ZEROS, then the zero for this bit position cannot be programmed during the present pulse. Therefore, signal MORE ZEROS (OUT) will be asserted to indicate that at least one additional pulse will be required. In this case, signal BIT (OUT) will also be set to one to mask out the zero for this bit position during the present programming pulse. In the case wherein BIT (IN) is a zero and the value of ZEROS (IN) is less than MAX ZEROS, then the zero for this bit position can be programmed during the current pulse. Therefore, signal MORE ZEROS (OUT) will not be asserted. Signal BIT (OUT) will be set to zero to provide the zero for this bit position during the present programming pulse.

To prevent a zero in a particular bit position from being programmed in more than one programming pulse, signal BIT (OUT) is fed back to nibble bit circuit 89. On each subsequent programming pulse after signal BIT (OUT) has had the value zero, BIT (OUT) will be set to one until the word has been programmed. Also, on each subsequent programming pulse after signal BIT (OUT) has had the value zero, signals ZEROS (IN) and MORE ZEROS (IN) will be passed through nibble bit circuit 89 unchanged and become signals ZEROS (OUT) and MORE ZEROS (OUT), respectively.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An operation control apparatus comprising:
    a timer circuit adapted to provide a done signal upon completion of timing a predetermined elapsed time interval initiated by a start signal;
    a blocking circuit adapted to receive the done signal and to provide the done signal as output if the done signal is not blocked when received;
    a control circuit adapted to receive a begin signal and a limit signal, the begin signal indicating that the operation is to be performed, the limit signal indicating whether a condition exists that would prevent the operation from being completed in a single step;
    if the limit signal indicates the operation can be completed in the single step, the control circuit starting the timing circuit and controlling performance of the single step until the done signal is received;
    if the limit signal indicates the operation cannot be completed in the single step, the control circuit dividing the single step into at least two sub-steps, during each sub-step, the control circuit starting the timing circuit and controlling performance of the sub-step until the done signal is received, the control circuit blocking the done signal during each sub-step until a final sub-step.

2. The apparatus of claim 1 wherein the operation to be performed is an erase operation that specifies an erase block to be erased within a flash memory.

3. The apparatus of claim 2 wherein the condition that exists that would prevent the erase block operation from being completed in a single step is insufficient erase current available to erase the entire erase block.

4. The apparatus of claim 3 wherein the single step is that of applying an erase pulse to the entire erase block to be erased.

5. The apparatus of claim 4 wherein if there is insufficient erase current available to erase the entire erase block using one erase pulse, the erase block is divided into sub-blocks and the erase pulse is supplied to a different one of the sub-blocks during each of the sub-steps.

6. The apparatus of claim 1 wherein the operation to be performed is a program operation that specifies data to be programmed within a flash memory.

7. The apparatus of claim 6 wherein a word of the data is specified.

8. The apparatus of claim 7 wherein the condition that exists that would prevent the program operation from being completed in a single step is insufficient program current available to program the entire word of data at once.

9. The apparatus of claim 8 wherein the single step is that of applying a program pulse to program the entire word of data to be programmed at once.

10. The apparatus of claim 9 wherein if there is insufficient program current available to program the entire word of data using one program pulse, the word of data to program is divided into sub-portions, a different one of the sub-portions is used to form a masked word during each of the sub-steps and the program pulse is supplied during each of the sub-steps.

11. The apparatus of claim 10 wherein the masked word to program during each of the sub-steps is formed by setting each bit of the word to program to one if the bit of the word to program does not belong to the sub-portion being programmed during the sub-step.

12. The apparatus of claim 11 wherein the program current can program at most N zeros at a time and the sub-portions are formed using no more than N bits of the word of data each sub-step.

13. The apparatus of claim 12 wherein the program current can program at most N zeros at a time and the sub-portions are formed so that at most N zeros of the word of data are programmed during each sub-step.

14. The apparatus of claim 1 wherein the begin signal is received from a state machine and the done signal is provided to the state machine if provided as output from the blocking circuit.

15. The apparatus of claim 14 wherein the state machine is a write state machine for a flash memory.

16. The apparatus of claim 14 wherein the state machine is a programmable logic array.

17. The apparatus of claim 14 wherein the state machine is a microprocessor operating under the control of a control program.

18. An operation control method comprising the steps of:
receiving an indication that an operation is to be performed;
determining whether a condition exists that would prevent the operation from being completed in a single step;
if the operation can be completed in the single step, performing the single step;
if the operation cannot be completed in the single step, dividing the single step into at least two sub-steps and performing each of the sub-steps until the operation has been performed; and
generating an indication that the operation has been performed when the operation to be performed has been completed.

19. The method of claim 18 wherein the operation to be performed is an erase operation that specifies an erase block to be erased within a flash memory.

20. The method of claim 19 wherein the condition that exists that would prevent the erase block operation from being completed in a single step is insufficient erase current available to erase the entire erase block.

21. The method of claim 20 wherein the single step is that of applying an erase pulse to the entire erase block to be erased.

22. The method of claim 21 wherein if there is insufficient erase current available to erase the entire erase block using one erase pulse, the erase block is divide into sub-blocks and the erase pulse is supplied to a different one of the sub-blocks during each of the sub-steps.

23. The method of claim 18 wherein the operation to be performed is a program operation that specifies data to be programmed within a flash memory.

24. The method of claim 23 wherein a word of the data is specified to be programmed during the program operation.

25. The method of claim 24 wherein the condition that exists that would prevent the program operation from being completed in a single step is insufficient program current available to program the entire word of data at once.

26. The method of claim 25 wherein the single step is that of applying a program pulse to program the entire word of data to be programmed at once.

27. The method of claim 26 wherein if there is insufficient program current available to program the entire word of data using one program pulse, the word of data to program is divided into sub-portions, a different one of the sub-portions is used to form a masked word during each of the sub-steps and the program pulse is supplied during each of the sub-steps.

28. The method of claim 27 wherein the masked word to program during each of the sub-steps is formed by setting each bit of the word to program to one if the bit of the word to program does not belong to the sub-portion being programmed during that sub-step.

29. The method of claim 28 wherein the program current can program at most N zeros at a time and the sub-portions are formed using no more than N bits of the word of data each sub-step.

30. The method of claim 29 wherein the program current can program at most N zeros at a time and the sub-portions are formed so that at most N zeros of the word of data are programmed during each sub-step.

31. The method of claim 18 wherein the indication that the operation to be performed is received from a state machine and the indication that the operation has been performed is provided to the state machine.

32. The method of claim 31 wherein the state machine is a write state machine for a flash memory.

33. The method of claim 31 wherein the state machine is a programmable logic array.

34. The method of claim 31 wherein the state machine is a microprocessor operating under the control of a control program.

35. Method comprising the steps of:
receiving an erase command for a portion of a memory, and, in response to the erase command:
(1) dividing an erase operation into sequential erase operations performed on two or more respective subsections of the portion of the memory if an amount of current available for erasure is below a predetermined amount; and;
(2) performing an erase operation on the portion of the memory without dividing the portion of the memory with respect to erase operations if the amount of current available for erasure is above the predetermined amount.

36. The method of claim 35, wherein the erase command is received from a write state machine on the memory.

37. The apparatus of claim 35, wherein the portion of the memory is a block of memory.

38. A method comprising the steps of:
(1) generating an erase command for a portion of a memory array, wherein the erase command is not dependent upon an amount of current available for erasure;
(2) receiving the erase command, and, in response to the erase command:

(a) dividing an erase operation into sequential erase operations performed on two or more respective subsections of the portion of the memory array if the amount of current available for erasure is below a predetermined amount, and;

(b) performing an erase operation on the portion of the memory array without dividing the portion of the memory array with respect to erase operations if the amount of current available for erasure is above the predetermined amount.

39. A method comprising the steps of:

receiving a program command for a portion of memory, and, in response to the program command:

(1) dividing a program operation into sequential program operations performed on two or more respective subsections of the portion of memory if an amount of current available for programming is below a predetermined amount; and, (2) performing a program operation on the portion of memory without dividing the portion of memory with respect to program operations if the amount of current available for programming is above the predetermined amount.

40. A method comprising the steps of:

receiving a program command for a portion of memory, and, in response to the program command:

(1) dividing a program operation into sequential program operations performed by applying two or more different bit patterns to the portion of memory if an amount of current available for programming is below a predetermined amount, and, (2) performing a program operation on the portion of memory without sequentially applying two or more different bit patterns to the portion of memory if the amount of current available for programming is above a predetermined amount.

* * * * *